(12) United States Patent
Enta

(10) Patent No.: US 7,353,120 B2
(45) Date of Patent: Apr. 1, 2008

(54) ELECTROSTATIC DISCHARGE MONITORING AND MANUFACTURING PROCESS CONTROL SYSTEM

(75) Inventor: Roger Enta, Waterloo (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 11/337,610

(22) Filed: Jan. 24, 2006

(65) Prior Publication Data

US 2007/0174011 A1    Jul. 26, 2007

(51) Int. Cl.
*G01R 31/00* (2006.01)

(52) U.S. Cl. ........................................ 702/58
(58) Field of Classification Search .................. 702/58, 702/59, 182–185, 188
See application file for complete search history.

(56) References Cited

U.S. PATENT DOCUMENTS

| | | | |
|---|---|---|---|
| 5,083,117 A | | 1/1992 | Hoigaard |
| 5,717,558 A | | 2/1998 | Lynn et al. |
| 5,835,327 A | | 11/1998 | Siew et al. |
| 6,052,053 A | * | 4/2000 | Jubin et al. .................. 340/540 |
| 6,172,496 B1 | | 1/2001 | Karins et al. |
| 6,205,408 B1 | | 3/2001 | Jubin et al. |
| 6,463,464 B1 | * | 10/2002 | Lazaridis et al. ........... 709/207 |
| 6,701,378 B1 | * | 3/2004 | Gilhuly et al. .............. 709/249 |
| 6,762,607 B2 | | 7/2004 | Kraz |
| 2003/0234651 A1 | | 12/2003 | Nguyen |

FOREIGN PATENT DOCUMENTS

| | | | |
|---|---|---|---|
| EP | 1 811 312 | * | 7/2007 |
| WO | WO03050547 A2 | | 6/2003 |
| WO | 2004054063 A2 | | 6/2004 |

* cited by examiner

*Primary Examiner*—Michael Nghiem
(74) *Attorney, Agent, or Firm*—Fasken Martineau

(57) ABSTRACT

There are disclosed systems, computer program products, and method for monitoring electrostatic discharge (ESD) fault conditions and controlling manufacturing processes on an assembly line. In an embodiment, each ESD monitored station in an assembly line is provided with at least one ESD management device (e.g. an ESD monitoring device or ESD protection device). Predetermined ESD fault conditions may be used to automatically stop a manufacturing process at an ESD monitored station. Upon occurrence of an ESD fault condition an ESD fault notification message may be sent identifying the ESD monitored station, the nature of the ESD fault condition, and whether the manufacturing process at the ESD monitored station is stopped. The ESD fault notification message may be sent to a mobile communications device, for example, and the manufacturing process at the ESD monitored device may be controlled based on a reply received from the mobile communications device.

15 Claims, 8 Drawing Sheets

- 412 → Location: Station Config Pack1
- 414 → ESD Risk Level: Low

Monitored Systems     Warning on fail?
- 416 → A) ESD Table     Yes X   No _
- 418 → B) Wrist Strap Monitor     Yes X   No _

Stop process on
- 420 → (A) Fail    Yes _   No X
- 422 → (B) Fail    Yes _   No X
- 424 → (A)&(B) Fail    Yes X   No _

Reporting and Lockout
- 426 → Send message on fail?    Yes X   No _
- 428 → Send message on warning?    Yes X   No _
- 430 → Master Lockout on fail?    Yes X   No _

FIG. 4B    400B

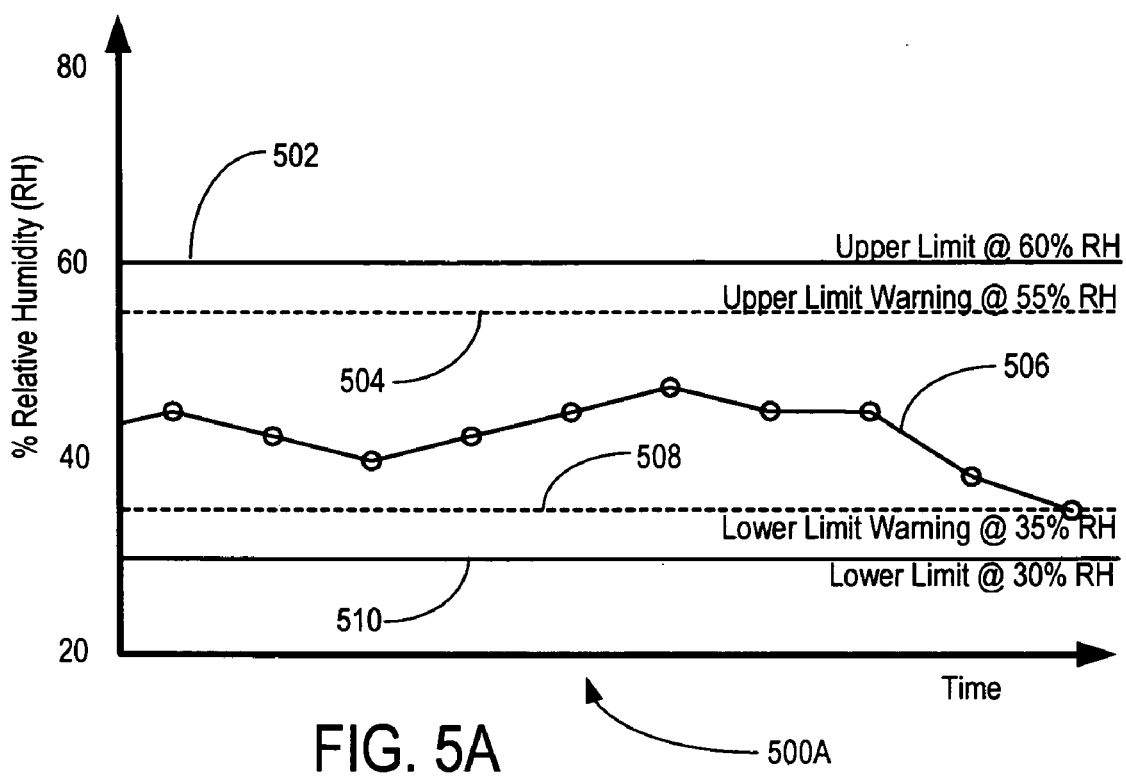

US 7,353,120 B2

ELECTROSTATIC DISCHARGE MONITORING AND MANUFACTURING PROCESS CONTROL SYSTEM

FIELD OF THE INVENTION

The present invention relates generally to the field of electrostatic discharge (ESD) monitoring and manufacturing process control systems.

BACKGROUND

Monitoring and controlling electrostatic discharge or ESD is an important function in electronics manufacturing, since uncontrolled discharge may seriously damage ESD-sensitive components. Damage often occurs at a microscopic level, such that the actual damage to a component may only be discovered in testing after manufacture, or after premature failure experienced by an end user.

Various ESD management devices, such as ESD monitoring devices and ESD protection devices, are available to help manage the risk of ESD during manufacturing and assembly of sensitive electronic components and devices. For example, an ESD monitoring device may monitor environmental conditions such as temperature and humidity, and may trigger an alarm if these conditions fall outside a preferred operating range. An ESD protection device may include, for example, an ionization bar for neutralizing static charge in the vicinity of an electronics assembly station. Another example of an ESD protection device is a wrist strap that may be used for electrically grounding an operator who may touch sensitive electronic components and devices during assembly.

Despite available ESD management devices, a manufacturing process may still produce faulty or damaged products if the ESD risk is not effectively managed at every station along an assembly line. While existing ESD monitoring devices and ESD protection devices may be designed to individually provide appropriate warnings, these warnings may not be properly acted upon unless they are quickly brought to the attention of appropriate personnel such as an ESD specialist. This may result in significant delays in recognizing critical ESD problems and stopping ESD damage to electronic components and printed circuit board (PCB) assemblies. Often, the damage is irreparable, and an entire batch of products may have to be scrapped for quality control purposes, at significant cost. Thus, improved systems and methods are needed.

BRIEF SUMMARY OF THE INVENTION

Thus, in an aspect of the invention, there is provided a method of monitoring electrostatic discharge (ESD) fault conditions and controlling a manufacturing process on an assembly line, comprising: providing at each ESD monitored station in the assembly line at least one ESD management device; monitoring each ESD management device for an occurrence of at least one ESD fault condition; upon occurrence of at least one ESD fault condition at an ESD monitored station, determining based on predetermined criteria whether the manufacturing process at the ESD monitored station should be stopped; and wirelessly sending a notification of the at least one ESD fault condition, the notification indicating whether the manufacturing process at the ESD monitored station is stopped.

In an embodiment, the method further comprises sending the notification to a mobile communications device.

In another embodiment, the method further comprises identifying in the notification the ESD monitored station and the nature of the ESD fault condition.

In yet another embodiment, the method further comprises providing in the notification a control action that may be taken by reply to the notification.

In still another embodiment, the method further comprises controlling the manufacturing process at the ESD monitored station based on the reply to the notification.

In another embodiment, the notification is an email message, and the method further comprises controlling the manufacturing process at the ESD monitored station based on a reply to the email message.

In another embodiment, the notification is an input to an application running on the mobile communications device, and the method further comprises controlling the manufacturing process at the ESD monitored station based on a control action reply output from the application.

In still another embodiment, the method further comprises controlling the manufacturing process at the ESD monitored station in response to a control action reply from a webpage accessible via a web browser application provided on the mobile communications device.

In another aspect of the invention, there is provided a system for monitoring electrostatic discharge (ESD) fault conditions and controlling a manufacturing process on an assembly line, the system adapted to: provide at each ESD monitored station in the assembly line at least one ESD management device; monitor each ESD management device for an occurrence of at least one ESD fault condition; upon occurrence of at least one ESD fault condition at an ESD monitored station, determine based on predetermined criteria whether the manufacturing process at the ESD monitored station should be stopped; and wirelessly send a notification of the at least one ESD fault condition, the notification indicating whether the manufacturing process at the ESD monitored station is stopped.

In an embodiment, the system is further adapted to send the notification to a mobile communications device.

In another embodiment, the system is further adapted to identify in the notification the ESD monitored station and the nature of the ESD fault condition.

In yet another embodiment, the system is further adapted to provide in the notification a control action that may be taken by reply to the notification.

In another embodiment, the system is further adapted to control the manufacturing process at the ESD monitored station based on the reply to the notification.

In still another embodiment, the notification is an email message, and the system is further adapted to control the manufacturing process at the ESD monitored station based on a reply to the email message.

In another embodiment, the notification is an input to an application running on the mobile communications device, and the system is further adapted to control the manufacturing process at the ESD monitored station based on a control action reply output from the application.

In yet another embodiment, the system is further adapted to control the manufacturing process at the ESD monitored station in response to a control action reply from a webpage accessible via a web browser application provided on the mobile communications device.

In another aspect of the invention, there is provided a computer program product comprising a computer readable medium storing computer code that when loaded into a computing device adapts the device to monitoring electrostatic discharge (ESD) fault conditions and control a manufacturing process on an assembly line, the computer readable medium including: code for monitoring each ESD management device at an ESD monitored station for an occurrence of at least one ESD fault condition; code for determining based on predetermined criteria whether the manufacturing process at the ESD monitored station should be stopped upon occurrence of at least one ESD fault condition at an ESD monitored station; and code for wirelessly sending a notification of the at least one ESD fault condition, the notification indicating whether the manufacturing process at the ESD monitored station is stopped.

In an embodiment, the computer readable medium further includes code for sending the notification to a mobile communications device.

In another embodiment, the computer readable medium further includes code for identifying in the notification the ESD monitored station and the nature of the ESD fault condition.

In yet another embodiment, the computer readable medium further includes code for providing in the notification a control action that may be taken by reply to the notification.

In still another embodiment, the computer readable medium further includes code for controlling the manufacturing process at the ESD monitored station based on the reply to the notification.

In another embodiment, the notification is an email message, and the computer readable medium further includes further includes code for controlling the manufacturing process at the ESD monitored station based on a reply to the email message.

In another embodiment, the notification is an input to an application running on the mobile communications device, and the computer readable medium further includes code for controlling the manufacturing process at the ESD monitored station based on a control action reply output from the application.

In still another embodiment, the computer readable medium further includes code for controlling the manufacturing process at the ESD monitored station in response to a control action reply from a webpage accessible via a web browser application provided on the mobile communications device.

In another aspect of the invention, there is provided a system for monitoring electrostatic discharge (ESD) fault conditions and controlling manufacturing processes on an assembly line, comprising: at least one ESD management device at each ESD monitored station in the assembly line, each ESD management device including means for indicating an ESD fault condition; an ESD control server operatively connected to each ESD management device, the ESD control server including necessary software drivers and monitoring software to integrate ESD devices from a plurality of vendors; means for monitoring an occurrence of at least one ESD fault condition; and means for determining based on the predetermined ESD fault conditions whether to stop the manufacturing process at an ESD monitored station having at least one ESD fault condition.

BRIEF DESCRIPTION OF THE DRAWINGS

In the figures which illustrate exemplary embodiments of the invention:

FIG. 4B is a schematic diagram of an illustrative screen associated with the ESD monitored station of FIG. 4A;

FIG. 5A is an illustrative graph of an ESD monitor that may measure relative humidity in the vicinity of an ESD monitored station;

FIG. 5B is a schematic diagram of an illustrative screen associated with the ESD monitor of FIG. 5A;

DETAILED DESCRIPTION

As noted above, the present invention relates to systems, computer program products, and methods for monitoring ESD and for controlling manufacturing processes.

The invention may be practiced in various embodiments. A suitably configured data processing system, and associated communications networks, devices, software and firmware may provide a platform for enabling one or more of the systems, computer program products, and methods.

Figure 1:
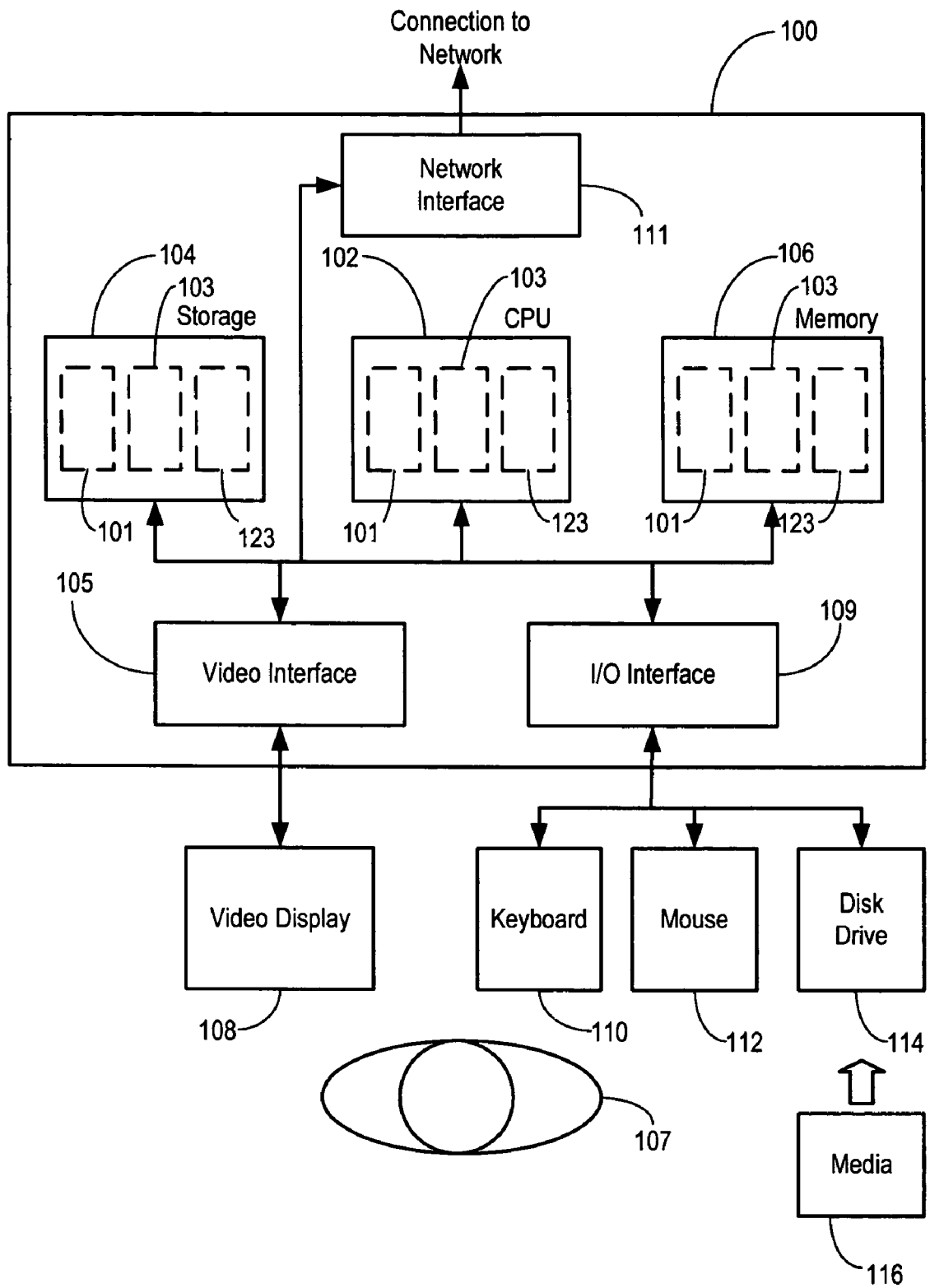
FIG. 1 is a schematic block diagram of a generic data processing system that may provide a suitable operating environment.

By way of example, FIG. 1 shows a generic data processing system 100 that may include a central processing unit ("CPU") 102 connected to a storage unit 104 and to a random access memory 106. The CPU 102 may process an operating system 101, application program 103, and data 123. The operating system 101, application program 103, and data 123 may be stored in storage unit 104 and loaded into memory 106, as may be required. An operator 107 may interact with the data processing system 100 using a video display 108 connected by a video interface 105, and various input/output devices such as a keyboard 110, mouse 112, and disk drive 114 connected by an I/O interface 109. In known manner, the mouse 112 may be configured to control movement of a cursor in the video display 108, and to operate various graphical user interface ("GUI") controls appearing in the video display 108 with a mouse button. The disk drive 114 may be configured to accept data processing system readable media 116. The data processing system 100 may form part of a network via a network interface 111, allowing the data processing system 100 to communicate with other suitably configured data processing systems (not shown).

Figure 2:
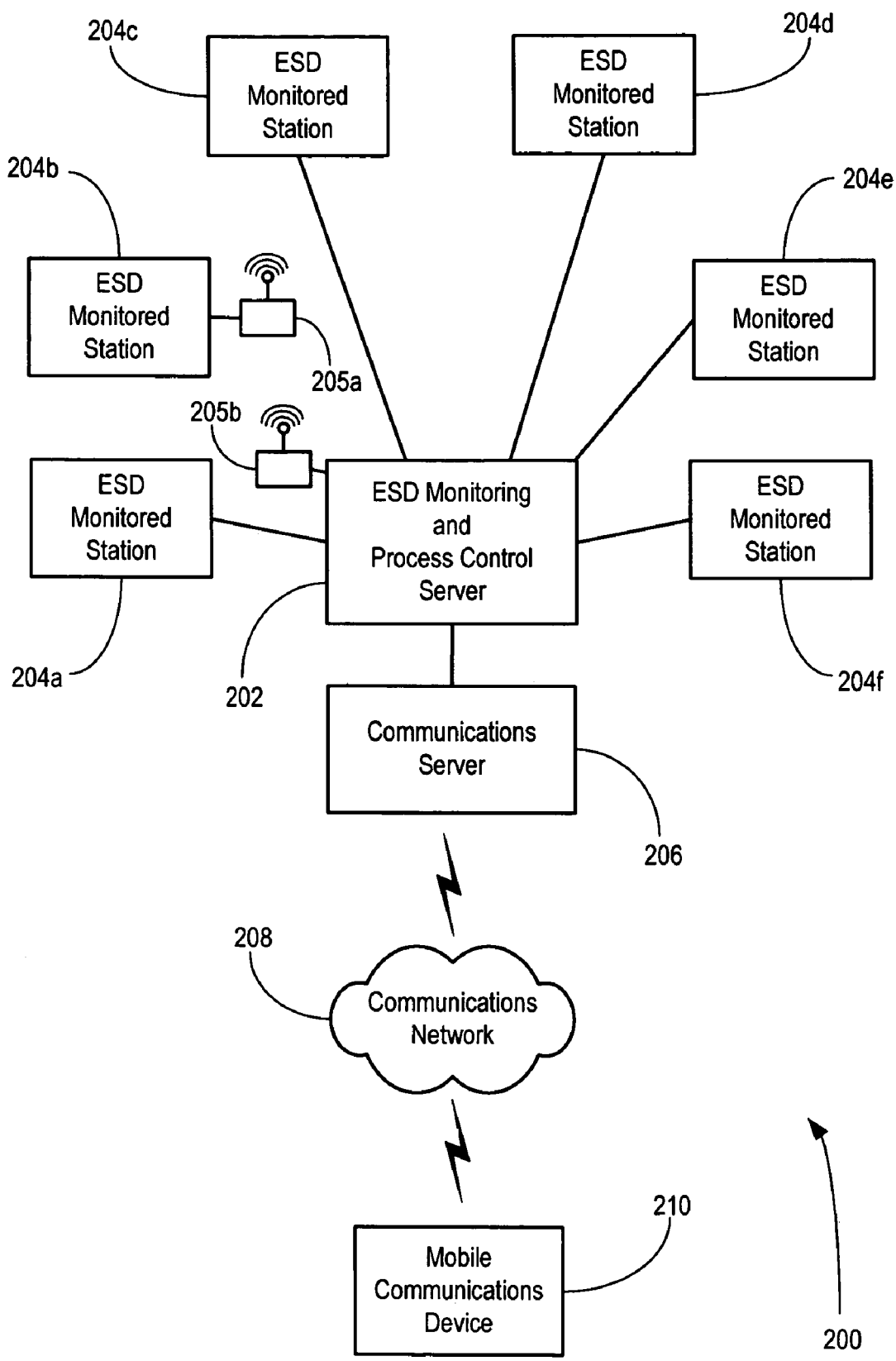
FIG. 2 is a schematic block diagram of an ESD monitoring and manufacturing process control system in accordance with an embodiment.

FIG. 2 is a schematic block diagram of an ESD monitoring and manufacturing process control system 200 (hereinafter referred to as the "ESD control system" 200) in accordance with an embodiment. As shown in FIG. 2, an ESD monitoring and manufacturing process control server 202 (hereinafter referred to as the "ESD control server" 202) may be configured to be in communication with various ESD monitoring devices and ESD protection devices located at each of a plurality of ESD monitored stations 204a-204f within an assembly line. ESD control server 202 may be embodied, for example, in a suitably configured data processing system such as data processing system 100 of FIG.

1. ESD control server 202 may be configured to run various application programs and software drivers to communicate with various peripheral devices.

In an embodiment, the ESD management devices (including ESD monitoring devices and ESD protection devices) provided at each station 204a-204f may be connected to a client communications node located at each station (e.g. see FIG. 3A, below). This client communications node may be configured to communicate with ESD control server 202 via common communication protocols such as Ethernet over a cable network, or via "WiFi" (IEEE 802.11) over a pair of wireless network transceivers 205a, 205b as shown by example for station 204b. It will be appreciated that the use of wireless protocols may eliminate the need for extensive cabling from each station 204a-204f to ESD control server 202. However, a reliable wireless link may not be possible in areas with high electromagnetic shielding and radio frequency interference.

ESD control server 202 may include an intelligent interface including necessary software drivers and monitoring software that allow integration of various ESD management devices, possibly from multiple vendors. Each ESD management device may include means for indicating an ESD fault condition, such as an alarm or a signal.

ESD control server 202 may be configured to monitor the status of each piece of ESD equipment from the plurality of ESD monitored station 204a-204f in an assembly line for an ESD fault condition. In the event of an alarm or signal of an ESD fault condition received from any one of the ESD monitored stations 204a-204f, ESD control server 202 may be configured for example to stop the entire assembly line, or to stop a critical manufacturing process at one of the stations 204a-204f in the assembly line. This stoppage may occur, for example, by shutting down a data entry screen or an assembly tool at an affected station, or by stopping a conveyor transporting work pieces between stations.

As will be further explained below, ESD control server 202 is intended to be a real-time monitor that can be tailored to meet the needs of an ESD control program for virtually any electronics assembly line. As well, collection of ESD data at ESD control server 202 may permit traditional statistical analysis techniques to be used in identifying problem stations or operators within an assembly line.

As shown in FIG. 2, ESD control server 202 and ESD monitored stations 204a-204f may form a local area network (LAN) within a manufacturing facility. However, in an embodiment, ESD control server 202 may be operatively connected to a communications server 206 that may be configured to manage communications over a wide area network (WAN) 208 to/from a mobile communications device 210. A mobile data communication device and corresponding host system acting as a communications server is described, for example, in U.S. Pat. No. 6,701,378 issued to Gilhuly et al., and U.S. Pat. No. 6,463,464 issued to Lazaridis et al., which are both incorporated by reference herein.

Figure 3A:
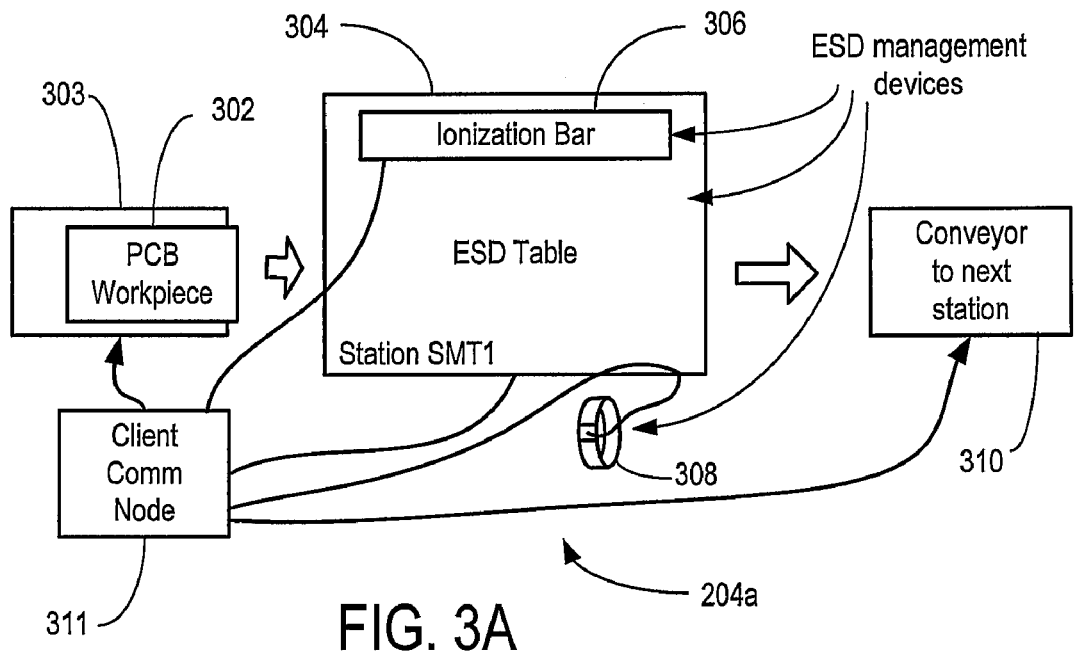
FIG. 3A is a schematic block diagram of an illustrative ESD monitored station that may be found in FIG. 2.

Now referring to FIG. 3A, shown is a schematic block diagram of an illustrative ESD monitored station (e.g. station 204a) that may be found in FIG. 2. By way of example, station 204a (labelled illustratively as "Station SMT1") may be a standalone station at which a human operator works with a PCB work piece 302 arriving via conveyor 303. Station 204a may include an electrically grounded ESD table 304 and an ionization bar 306 to neutralize static charge caused by machine model (MM) and charge device model (CDM) type ESD events. Station 204a may further include a wrist strap 308 to be worn by the human operator to protect electronic components from human body model (HBM) type ESD events. Once the human operator has completed work on PCB work piece 302, he may place the work piece on another conveyor 310 to the next station in the assembly line.

As shown in FIG. 3A, each of ESD table 304, ionization bar 306, and wrist strap 308 may be operatively connected to a client communications node 311. Client communications node 311 may be configured to allow communications between each of ESD table 304, ionization bar 306, and wrist strap 308, and the ESD control server 202 of FIG. 2. Client communications node 311 may also be operatively connected to motor controllers controlling conveyors 303, 310 to stop or restart one or both of conveyors 303, 310, and thus effectively control the process at station 204a during an ESD fault condition at station 204a.

Figure 3B:
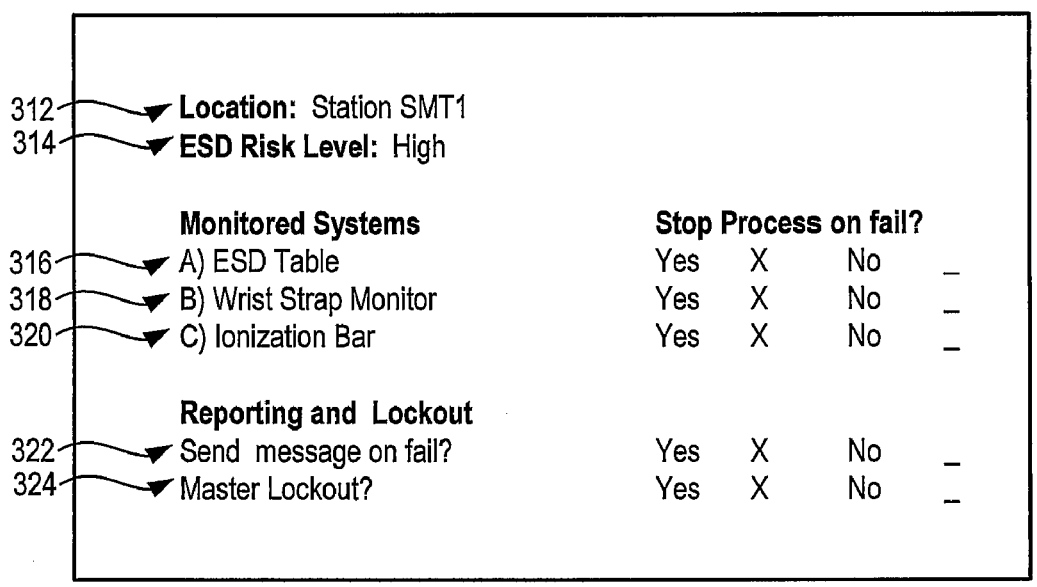
FIG. 3B is a schematic diagram of an illustrative screen associated with the ESD monitored station of FIG. 3A.

Now referring to FIG. 3B, shown is a schematic diagram of an illustrative screen 300B associated with station 204a of FIG. 3A that may be shown, for example, at ESD control server 202. By way of example, screen 300B may include an indication of a station location 312 and the ESD risk level 314 at the station. In this example, the ESD risk level at Station SMT1 is deemed to be high.

Screen 300B may further include information on the monitored ESD systems 316, 318, 320, which in this example includes the ESD table, wrist strap, and ionization bar. Each of these monitored systems 316, 318, 320 may have a user selectable option of stopping the process at location 312 upon certain predetermined criteria, such as a failure indication received from any one of the monitored systems 316, 318, 320. In this example, a fault indication or failure of any one of the monitored systems 316, 318, 320 will result in the process at station 204a being stopped.

In addition, screen 300B may include a user selectable option for reporting the failure message to appropriate personnel (e.g. an ESD specialist), and for locking out the operator at station 204a from performing further assembly work until the ESD fault condition is investigated by the ESD specialist (e.g. by stopping one or both of conveyors 303 and 310).

Figure 4A:
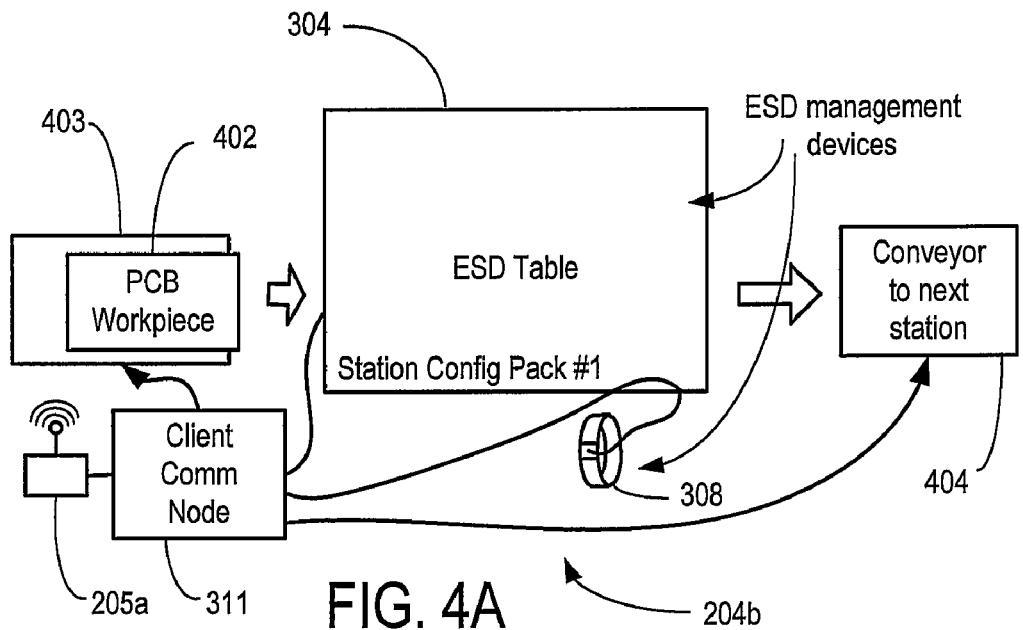
FIG. 4A is a schematic block diagram of another illustrative ESD monitored station that may be found in FIG. 2.

Now referring to FIG. 4A, shown is a schematic block diagram of another illustrative ESD monitored station (e.g. station 204b) that may be found in FIG. 2. As shown in FIG. 4A, station 204b may include an ESD table 304, and a wrist strap monitor 308. Station 204b may be another standalone station at which a human operator works with a work piece 402 arriving via conveyor 403, and upon completion of his task places the work piece on another conveyor 404 to the next station. Station 204b is configured with a wireless transceiver 205a in order to communicate wirelessly with ESD control server 202.

FIG. 4B is a schematic diagram of an illustrative screen 400B associated with station 204b of FIG. 4A that may be shown, for example, at ESD control server 202 (FIG. 2). As shown in FIG. 4B, screen 400B may include an indication of the station location 412 and the ESD risk level 414 at the station. In this example, the ESD risk level at "Station Config Pack1" is deemed to be low.

Screen 400B may further include information on the monitored systems 416, 418. Here, the monitored systems include an ESD table, and a wrist strap monitor. Predetermined criteria may specify that failure of either of the monitored systems 416, 418 may prompt a warning, as selectable by a user.

Screen 400B may also provide various user selectable options 420, 422, 424 for establishing predetermined criteria for stopping the process at location 412 upon a failure indication received from one of, or both of the monitored systems 416, 418. In this example, the failure of only one of monitored system 416 or 418 does not result in a process stop at location 412. However, failure of both monitored systems 416 and 418 is deemed to be serious enough to stop the process at location 412 (e.g. by stopping one or both of conveyors 403, 404) until the ESD fault condition is investigated and resolved by an ESD specialist.

Screen 400B may further include user selectable options for reporting the warnings or failure messages to appropriate personnel (e.g. the ESD specialist), and for locking out the operator at location 412 from performing further work until the ESD fault condition is investigated by the ESD specialist.

Now referring to FIG. 5A, shown is an illustrative graph 500A from an ESD monitor that may measure relative humidity in the vicinity of a station. As shown in FIG. 5A, certain limits may be set to define an operating range for relative humidity at a given station. For example, an upper limit 502 may be set at 60% relative humidity. An upper limit warning 504 may be set at 55% relative humidity. A corresponding lower limit warning 508 may be set at 35% relative humidity, and a lower limit 510 may be set at 30% relative humidity. It will be appreciated that the limits provided here are for illustrative purposes only.

Still referring to FIG. 5A, the measured relative humidity 506 at a given station may be tracked over time. As long as the relative humidity 506 is within a normal operating range, the process or task at the station being monitored may continue.

Now referring to FIG. 5B, shown is a schematic diagram of an illustrative screen 500B associated with the station shown in graph 500A of FIG. 5A. Screen 500B may include an indication of the station location 512 and the ESD risk level 514 at the station. In this example, the ESD risk level at "Station SMT5" is deemed to be high.

Screen 500B may also provide at 516 an indication of the limits of the range for the humidity sensor. These limits may be configured to be selectable by a user if appropriate.

Screen 500B may further provide user selectable options 518, 520, 522 for stopping the process at location 512. By way of example, if the relative humidity reaches the upper limit of 60% or the lower limit of 30%, the process at location 512 may be stopped. Alternatively, the process at location 512 may also be stopped by remote control, as indicated at 522. This will be explained in further detail with respect to FIGS. 6A and 6B, below.

Screen 500B may also show various user selectable options 524, 526, 528 for reporting warnings or fault indications, and for locking out the operator at Station SMT5. In this example, messages are sent to appropriate personnel (e.g. the ESD specialist) upon a failure or a warning, and the station is also locked out until the ESD fault condition can be investigated.

Figure 6A:
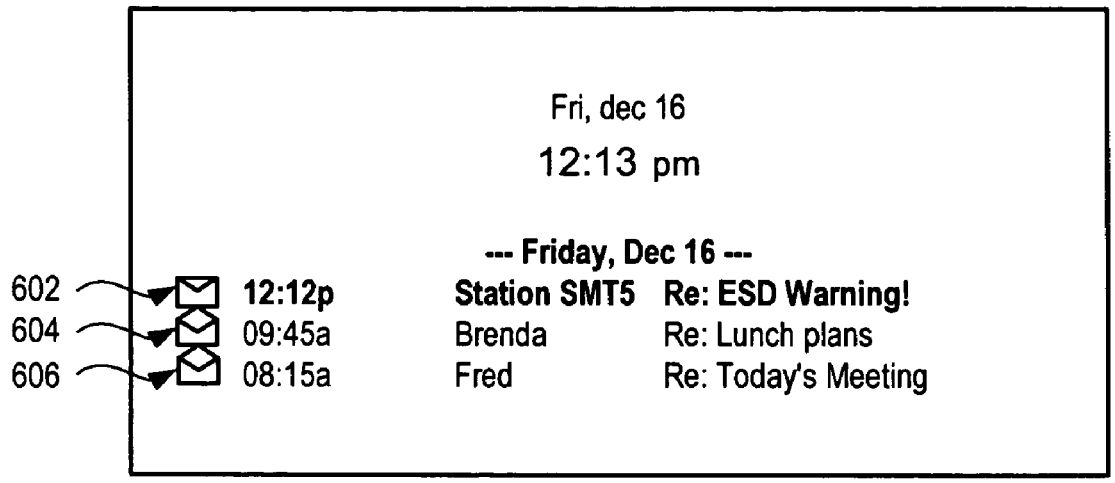
FIG. 6A is a schematic diagram of an illustrative screen that may display a warning message at a mobile communications device.

Now referring to FIG. 6A, shown is a schematic diagram of an illustrative screen that may be displayed at the mobile communications device of FIG. 2. For example, if Station SMT5 described in FIGS. 5A and 5B has reached a lower limit warning level of 35% relative humidity, ESD control server 202 may be configured to initiate an email notification as shown at 602. The email notification from Station SMT1 may be in a similar format as other email messages 604, 606 received at mobile communications device 210.

Figure 6B:
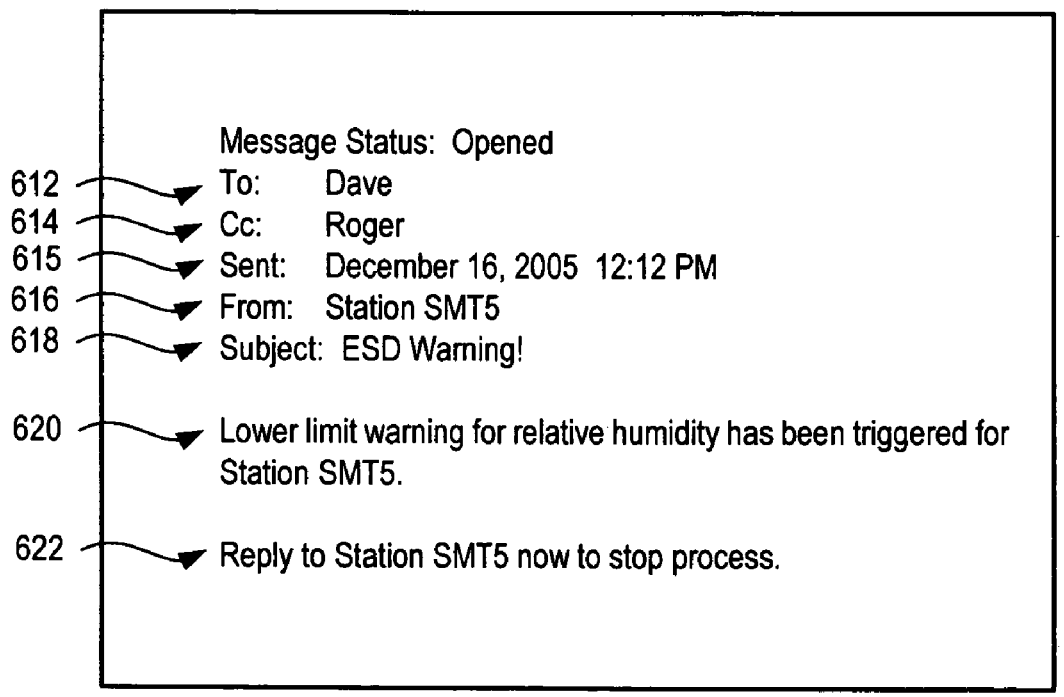
FIG. 6B is a schematic diagram of details of the warning message received at the mobile communications device.

Now referring to FIG. 6B, shown is an illustrative content of the warning message 600B received at the mobile communications device of FIG. 2. By way of example, the message 600B may include an indication of the appropriate personnel 612, 614 to whom the message was sent or copied, the date and time 615 of the warning, the station 616 at which the warning originated, and the subject line 618 indicating the nature of the warning.

Message 600B may provide further details 620 on the warning condition, and also suggest at 622 a course of action for responding to the warning condition. In an embodiment the recipient of this warning message 600B may, for example, manually stop the process at Station SMT5 by simply replying to the email message. ESD control server 202 may be preconfigured to initiate a stop in the process at Station SMT5 upon receipt of the email reply, and to lockout the operator at Station SMT5 until the ESD condition is investigated. Various other means for remote control may include, for example, an application program running on the mobile communications device 210 that may generate a particular control signal that may be communicated directly or via ESD control server 202 to stop the process at Station SMT5. Alternatively, mobile communications device 210 may be configured to access an Internet webpage via a suitably configured Internet browser application running on the device 210. Stopping the process may be controlled, for example, by selecting options or entering suitable commands via the remotely accessed website.

In another embodiment, if an ESD specialist has received a message indicating that a process at a station has been stopped due to an ESD fault condition, the ESD specialist may decide to investigate, for example, by contacting the operator at the station. If after investigation it is determined that the process can continue (e.g. the ESD specialist has reminded the operator to wear his wrist band properly), the ESD specialist may be given an option to remotely restart a stopped process via the mobile communications device 210 (e.g. by replying to the message).

As will be appreciated, the constant monitoring of ESD conditions at the plurality of ESD monitored stations 204a-204f via ESD control server 202 may quickly bring to a stop a critical manufacturing process until the ESD fault condition can be investigated and brought back under control. As well, immediate notification of appropriate personnel via email notification to a mobile communications device, for example, may provide additional oversight and flexibility in managing the ESD fault conditions depending on severity and depending on the results of an investigation by the ESD specialist. This ESD monitoring and control of an assembly line may provide significant improvements in reduction of ESD damaged products.

Figure 7A:
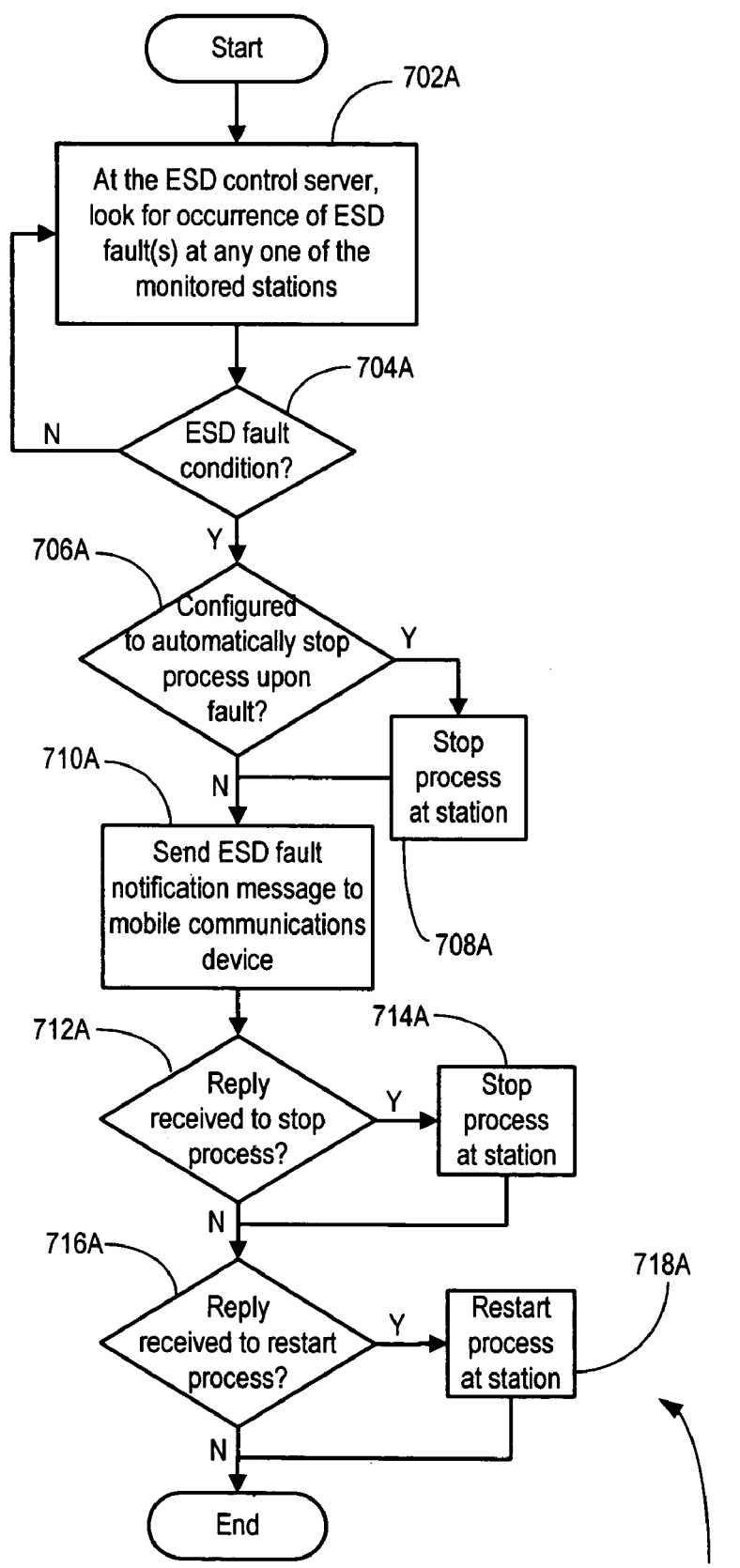
FIGS. 7A and 7B show flowcharts of an illustrative method in accordance with an embodiment.
Figure 7B:
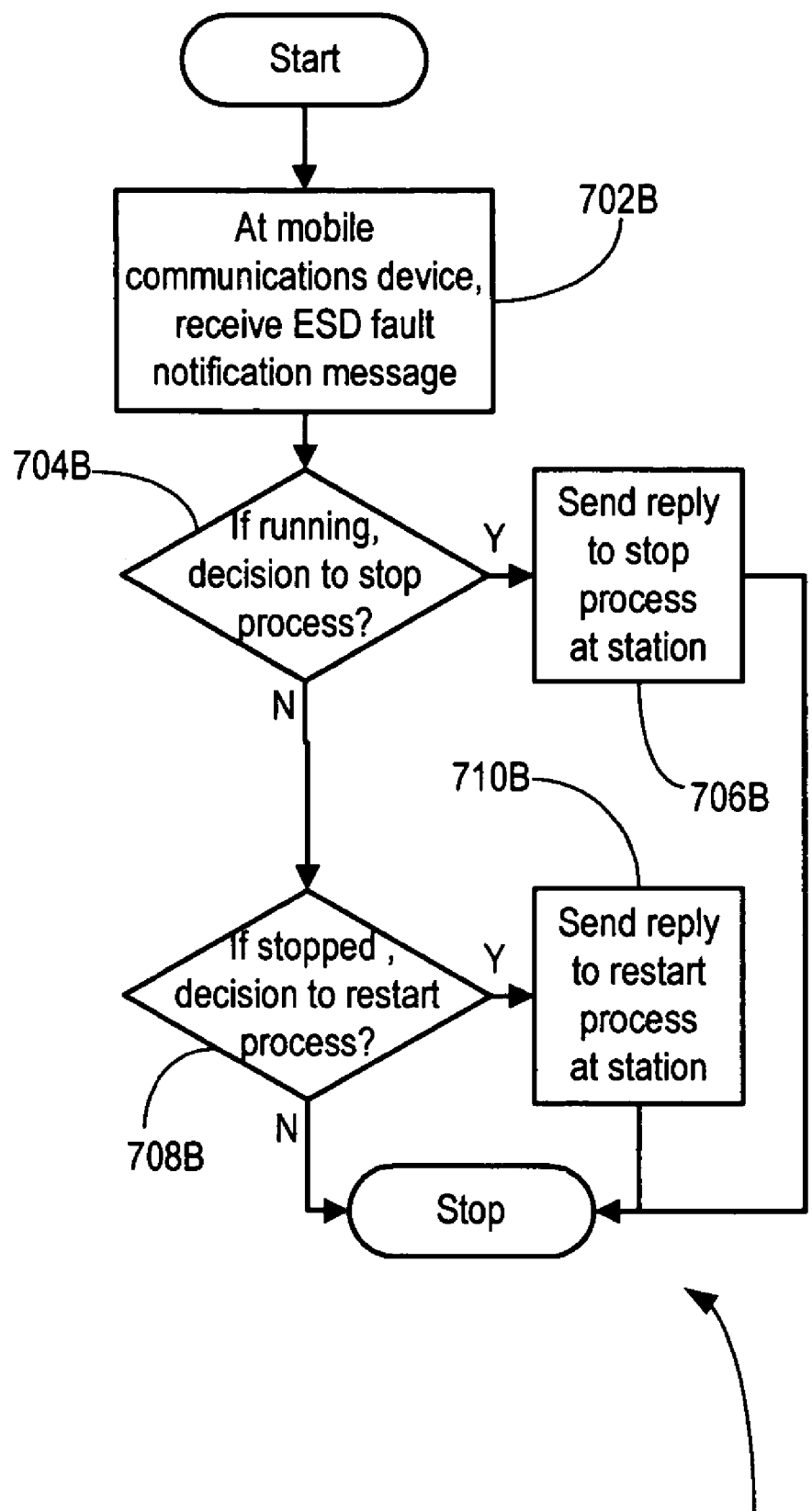

Now referring to FIGS. 7A and 7B, shown are flowcharts of an illustrative method in accordance with an embodiment. As shown in FIG. 7A, method 700A begins at block 702A where, at the ESD control server 202, method 700A looks for an ESD fault condition reported by any one of the ESD monitored stations 204a-204f. If at decision block 704A the answer is no, method 700A loops back to block 702A. If the answer is yes, method 700A proceeds to decision block 706A, where method 700A determines if the severity of the ESD fault condition calls for an automatic stopping of the process at the station. If the answer is yes, method 700A proceeds to block 708A where the process at the station with the ESD fault is stopped (e.g. by stopping a conveyor, preventing data entry, disabling a tool, etc.). Method 700A then proceeds to block 710A. If the answer at decision block 706A is no, method 700A proceeds to block 710A directly.

At block 710A, method 700A sends an ESD fault notification message to mobile communications device 210. Method 700A then waits for a reply from the mobile communications device 210. If at decision block 712A a reply is received to stop a process at a station (assuming that the process at the station is not already stopped), then method 700A proceeds to block 714A to stop the process at the station with the ESD fault condition. Alternatively, if at decision block 716A a reply is received to restart a process at a station (assuming that the process at the station is stopped), then method 700A proceeds to block 718A to restart the process at the station. Method 700A then ends.

As shown in FIG. 7B, method 700B begins at block 702B at which an ESD fault notification message is received at the mobile communications device 210. If at decision block 704B the message received is an ESD warning, and the ESD specialist decides to stop the process, method 700B proceeds to block 706B where method 700B sends a reply to stop the process at the station with the ESD fault notification. Alternatively, if at decision block 708B the message received indicates that a process at a station has been automatically stopped, and the ESD specialist decides to restart the process, then method 700B may proceed to block 710B where method 700B sends a reply to restart the process at the station.

It will be appreciated that the methods described with reference to FIGS. 7A and 7B are merely illustrative, and various other methods may be used to stop or restart a process at a station with an ESD fault condition. For example, instead of sending a reply message to an ESD fault condition notification, the ESD specialist may access an Internet webpage via a web browser application provided on the mobile communications device to access control action functions (e.g. start or stop) for each ESD monitored station. Alternatively, an application may be suitably configured to run on the mobile communications device to receive notification of an ESD fault condition as an input, and to send a control action output reply to remotely control start and stop functions for various ESD monitored stations.

What is claimed is:

1. A method of monitoring electrostatic discharge (ESD) fault conditions and controlling a manufacturing process on an assembly line, comprising:
    providing at each ESD monitored station in the assembly line at least one ESD management device;
    monitoring each ESD management device for an occurrence of at least one ESD fault condition;
    upon occurrence of at least one ESD fault condition at an ESD monitored station, determining based on predetermined criteria whether the manufacturing process at the ESD monitored station should be stopped;
    sending a notification of the at least one ESD fault condition to a mobile communication device, the notification indicating whether the manufacturing process at the ESD monitored station is stopped; and
    providing in the notification a control action that may be taken by reply to the notification.

2. The method of claim 1, further comprising controlling the manufacturing process at the ESD monitored station based on the reply to the notification.

3. The method of claim 1, wherein the notification is an email message, and the method further comprises controlling the manufacturing process at the ESD monitored station based on a reply to the email message.

4. The method of claim 1, wherein the notification is an input to an application running on the mobile communications device, and the method further comprises controlling the manufacturing process at the ESD monitored station based on a control action reply output from the application.

5. The method of claim 1, further comprising identifying in the notification the ESD monitored station and the nature of the ESD fault condition.

6. The method of claim 5, further comprising controlling the manufacturing process at the ESD monitored station in response to a control action reply from a webpage accessible via a web browser application provided on the mobile communications device.

7. A system for monitoring electrostatic discharge (ESD) fault conditions and controlling a manufacturing process on an assembly line, the system comprising computing means and storing means adapted to:
    provide at each ESD monitored station in the assembly line at least one ESD management device;
    monitor each ESD management device for an occurrence of at least one ESD fault condition;
    upon occurrence of at least one ESD fault condition at an ESD monitored station, determine based on predetermined criteria whether the manufacturing process at the ESD monitored station should be stopped;
    send a notification of the at least one ESD fault condition to a mobile communication device, the notification indicating whether the manufacturing process at the ESD monitored station is stopped; and
    provide in the notification a control action that may be taken by reply to the notification.

8. The system of claim 7, wherein the system is further adapted to control the manufacturing process at the ESD monitored station based on the reply to the notification.

9. The system of claim 7, wherein the notification is an email message, and the system is further adapted to control the manufacturing process at the ESD monitored station based on a reply to the email message.

10. The system of claim 7, wherein the notification is an input to an application running on the mobile communications device, and the system is further adapted to control the manufacturing process at the ESD monitored station based on a control action reply output from the application.

11. The system of claim 7, wherein the system is further adapted to identify in the notification the ESD monitored station and the nature of the ESD fault condition.

12. The system of claim 11, wherein the system is further adapted to control the manufacturing process at the ESD monitored station in response to a control action reply from a webpage accessible via a web browser application provided on the mobile communications device.

13. A computer program product comprising a computer readable medium storing computer code that when loaded into a computing device adapts the device to monitoring electrostatic discharge (ESD) fault conditions and control a manufacturing process on an assembly line, the computer readable medium including:
    code for monitoring each ESD management device at an ESD monitored station in the assembly line for an occurrence of at least one ESD fault condition;
    code for determining based on predetermined criteria whether the manufacturing process at the ESD monitored station should be stopped upon occurrence of at least one ESD fault condition at an ESD monitored station;
    code for sending a notification of the at least one ESD fault condition to a mobile communication device, the notification indicating whether the manufacturing process at the ESD monitored station is stopped; and code for providing in the notification a control action that may be taken by reply to the notification.

14. The computer program product of claim 13, wherein the computer readable medium further includes code for controlling the manufacturing process at the ESD monitored station based on the reply to the notification.

15. The computer program product of claim 13, wherein the computer readable medium further includes code for identifying in the notification the ESD monitored station and the nature of the ESD fault condition.

* * * * *